United States Patent [19]
Rogren

[11] Patent Number: 5,625,228
[45] Date of Patent: Apr. 29, 1997

[54] HIGH PERFORMANCE SEMICONDUCTOR PACKAGE WITH AREA ARRAY LEADS

[76] Inventor: Philip E. Rogren, 624 Silver Ave., Half Moon Bay, Calif. 94019-1565

[21] Appl. No.: 395,385

[22] Filed: Feb. 27, 1995

[51] Int. Cl.$^6$ .............................. H01L 23/34; H05K 7/20
[52] U.S. Cl. ...................... 257/712; 257/713; 257/719; 257/697; 361/704; 361/707; 361/709; 361/714
[58] Field of Search ...................... 257/712, 713, 257/719, 796, 697, 738; 361/704, 707, 709, 714

Primary Examiner—Carl Whitehead, Jr.

[57] ABSTRACT

A package for high performance semiconductor devices is disclosed. The package has area array leads which can be pins, solder balls, or conductive pads. The package provides increased electrical and thermal performance at a cost that is less than that of previous technology. The packages is comprised of a printed wiring board type substrate to provide multilayer electrical connections and a thermally conductive case that encloses the top surface and the edges of the wiring substrate. The semiconductor device can be mounted directly on the thermally conductive case and connected to the substrate by any of the common methods for making first level interconnections. In the preferred embodiment, the case is comprised of copper or a copper alloy that is treated to enhance appearance and to prevent oxidation of the surface of the case. In addition to enhancing the thermal properties of the package, the copper case can also serve as a very low noise ground plane. The forged metal case with integral design features and appropriate surface finishes significantly enhance the appearance and perceived value of the package.

9 Claims, 4 Drawing Sheets

Fig. 7e

HIGH PERFORMANCE SEMICONDUCTOR PACKAGE WITH AREA ARRAY LEADS

BACKGROUND

1. Field of Invention

This invention relates to packages for semiconductor devices in general, and specifically to high performance, low cost pin grid array, ball grid array, and pad grid array packages for semiconductor devices.

2. Discussion of Prior Art

Until quite recently, the standard for high performance semiconductor packages were packages made of alumina ceramic with multiple layers of tungsten conductors within the monolithic ceramic structure. These packages are known as multi layer cofire (MLC) ceramic packages. The chief advantage of this construction is that it provides virtually perfect protection for the semiconductor chip it houses. Most significantly, once sealed, the chip is not exposed to the exterior environment to any significant degree. In other words, MLC packages are highly hermetic. Hermeticity was important to early die because their surfaces were prone to deterioration from the mix of gases and moisture in the normal environment. MLC packages also provided great flexibility of design to accommodate the electrical requirements of high performance die. That design flexibility came from the ability to route the electrical interconnection on several conductor layers. MLC packages also have good thermal performance due to the relatively high thermal conductivity of the alumina ceramic. It is possible to augment the basically good thermal performance through the application of heat spreaders constructed of metal matrix composite of copper and tungsten.

With all of the benefits of MLC packages, there are two issues that are causing a shift to other technology. Those issues are cost and electrical performance. The processes used to manufacture MLC packages are energy intensive and the materials used are expensive. The result is that MLC packages, when manufactured in the highest volumes and with the greatest efficiency, cost around $0.05 per lead for the most common types. This compares to between $0.01 and $0.02 per lead for the most common of semiconductor packages.

The high performance devices that have traditionally used MLC packages, such as microprocessors, have typically been of high enough value themselves to hide the high cost of the packages. If this were the only problem, inertia alone would probably perpetuate the use of MLC packages for many years. The electrical performance issues, on the other hand are driving a switch away from MLC packages. The problem with MLC is in the basic materials set. The dielectric constant of the alumina dielectric is around 10 and the resistivity of the tungsten conductors is in the range of 0.01 Ω/sq. Those properties, combined with the physical scale and relationships of package components yield structures that generate significant noise in both the signal lines and in the power and ground planes at high operating frequencies. That noise is roughly proportional to frequency. The problem of noise, and increasing noise with increasing speed is exacerbated by the fact that as semiconductor technology advances, operating frequencies increase geometrically and operating voltages, and thus noise immunity, decreases.

These problems are driving a search for packaging that provides higher electrical performance while maintaining the thermal performance of MLC, and hopefully reducing price. Currently the most promising candidate for packaging technology to replace MLC is packaging based on laminate, or PC board substrates to provide the multilayer wiring flexibility. The combinations of resinous materials and reinforcing fibers that form the basis for laminate substrates have dielectric constants of less than five and the copper conductors have resistivities of less than 0.001 Ω/sq. The result is a very significant reduction in noise and the ability to design the impedance of signal lines to much more nearly match that of the die. The traditional problem with laminate based packages is low thermal performance of the basic materials set. The copper is a very good thermal conductor but the quantities of copper in a typical package are small relative to the resin and fiber, which have very low thermal conductivity. Current methods of improving the thermal performance of laminate packages involve attaching a copper slug to the package substrate and thermally connecting the chip to the slug either with thermal vias or by attaching the chip directly to the slug.

The practicality of using a metal slug as a thermal management tool in laminate based semiconductor packages has proven to significantly extend the usefulness and applicability of this type of package. While packages with these copper slugs have superior thermal performance, they are not cosmetically acceptable for device that may sell at retail for more than one thousand dollars.

The cosmetic issues have been addressed by some manufacturers by molding a package exterior around the laminate substrate and the metal slug. Packages produced in this manner are functionally equivalent or superior to the more basic laminate based packages and do have a much more finished appearance. The problem is that the molding process is relatively slow and expensive, regardless of the volume or extent of the package that is molded. While the cosmetics are significantly improved over the basic approach, the packages still suffers cosmetically and in terms of perceived value next to MLC ceramic packages. In addition, molded packages require the use of more expensive substrate materials the can stand up to the high temperatures and pressures associated with molding operations.

The objective of the present invention is to provide the maximum possible electrical, thermal, and mechanical performance, plus cosmetics properties that enhance perceived value to the level of high cost competitive technology, and do so for an absolute minimum cost. The package described here accomplishes the performance goals while providing for manufacturing costs that are below those of competing technologies. The present invention achieves those objectives by redefining how and with which components, the package meets its functional requirements. For any package, those basic functional requirements are: 1) protection of the chip itself; 2) translation of the geometries on the chip to those of the system level interconnects; 3) preservation of the electronic potential of the chip; 4) moving heat from the chip to the environment; and 5) to provide a form factor and interface technique compatible with the system level application.

The last requirement is the by the application, and in the case of the present invention, that is area array contacts using pins, solder balls, or conductive pads. Semiconductor packaging, including high performance area array packages, started out by addressing the requirements for protection and geometric translation. The electrical and thermal performance requirements have been relative late comers to the list. With current technology they have been addressed largely by adding features to then current standard package designs. This reactive, evolutionary process has lead to packages with adequate electrical and thermal performance and mechanical properties sufficient for the job, but also to packages employing high cost materials and processes. In addition, the resulting packages, particularly plastic packages, do not have the cosmetic properties consistent with devices that may sell at retail for more than one thousand dollars.

High performance plastic packages utilize metal heat spreaders or heat sinks to deal with the thermal requirements of high performance die. Those heat sinks constitute the mechanically most stable materials in plastic packages. They are not, however, applied in ways to take much advantage of their mechanical properties. In addition to the mechanical and thermal properties of the heat sink, it is also a potential electrical element in the package. Again, in packages based on current technology, only minimal use is made of this resource that must be included in order to address thermal management issues. By converting the heat spreader to be the mechanical foundation of the package and applying relatively unsophisticated forming techniques to the manufacture of the heat spreader, it is converted in the present invention, from a flat piece of metal to an enclosure and mounting system for the die and the electrical interconnect system of the package substrate.

While there are several methods that could be utilized to produce the heat spreader, or case of the present invention, the most cost effective method is forging. By forging the heat spreader, the complex shapes required for the current invention can be produced for very little more than the cost of the current flat heat spreader.

The initial advantages of the forged heat spreader are superior mechanical properties with little or no increase in mass or cost. The mechanical properties of the case 10 shown in FIG. 1, arise from the basic properties of the materials that comprise it, but also from its shape and from the work hardening that results in the forging process.

The ramifications of making the heat spreader the housing for the rest of the package components are far reaching. First of all, with the thermally conductive material covering the entire top and all four sides of the package, the area of effective hear removal surface can be as much as five times that common in competitive technologies. By removing the mechanical requirements of supporting the packages from the substrate, the substrate materials can be selected for their cost and electrical properties.

Conventional flat heat spreaders have traditionally been attached to the package substrate with thermoset epoxies that cover the entire area where the heat spreader and substrate overlap. By replacing the area attachment with well chosen attachment points and replacing epoxy with solder, cost is significantly reduced and the mechanical properties of the packages can be tailored to accommodate the anticipated environmental challenges for the package.

Despite the advantages of current area array, laminate based packages, all of the heretofore known package structures suffer from a number of disadvantages:

(a) The cost of materials and processing is high, even approaching that of the MLC ceramic packages.

(b) The cosmetics of the best of conventional laminate based packages is inferior to that of MLC ceramic.

(c) Expensive materials are required due to processes with high time/temperature integrals.

(d) Thermal performance, in terms of moving heat from the package surface to the surrounding environment is limited.

(e) Electrical performance is not optimized.

OBJECTS AND ADVANTAGES

Accordingly, several objects and advantages of the present invention are:

(a) to provide a package construction and processes to assemble high performance semiconductor packages that result in significant cost savings over current methodologies;

(b) to provide a high performance semiconductor packages that has appearance characteristics that give it a perceived value that matches or exceeds that of MLC ceramic;

(c) to provide a set of processes that make use of the lowest cost materials to construct a package that is superior in electrical and thermal performance as well as instilling a perception of greater value relative to conventional laminate based packages;

(d) to provide a package that maximizes the ability of the package to dissipate heat from the package surface to the environment.

(e) provides a package with the lowest possible inductance in the ground circuit and one that offers increased design flexibility and thus the ability to more accurately match the package characteristics to the requirements of the die it will hold.

| Reference Numerals in drawings | |
|---|---|
| 10 case | 12 substrate |
| 14 dielectric material | 15 wire bond area |
| 16 die attach cavity | 17 wire bonds |
| 18 semiconductor die | 20 die attach pedestal |
| 22 adhesive material | 24 peripheral attachment |
| 26 interior attachment points | points |
| 30 pins | 28 die periphery attachment |
| 34 primary surface of | area |
| inside of case | 32 seal ring |
| 38 solder balls | 36 conductive pads |
| 42 interior attachment pedestals | 40 peripheral attachment |
| 46 peripheral attachment pads | pedestals |
| 50 die periphery attachment pad | 44 die periphery attachment |
| 54 structural cavity | pedestal |
| 58 heat fins | 48 interior attachment pads |
| 62 TAB lead | 52 case side wall |
| 66 bond pad | 56 finished cavity area |
| 70 flip chip ball | 60 TAB die |
| 74 area array flip chip die | 64 die attach adhesive |
| | 68 thermal gel |
| | 72 flip chip die |

DESCRIPTION

FIGS. 1 TO 7

Figure 1:
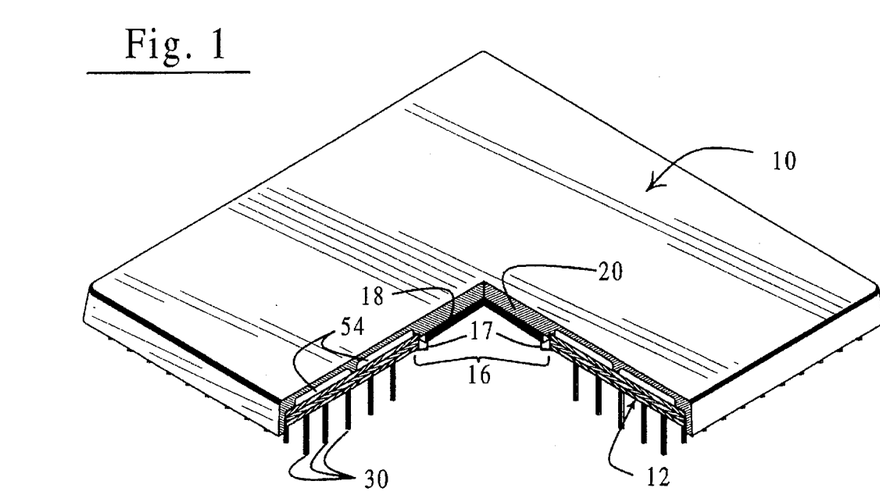
FIG. 1 shows a perspective view of a package with thermally conductive case.
Figure 2:
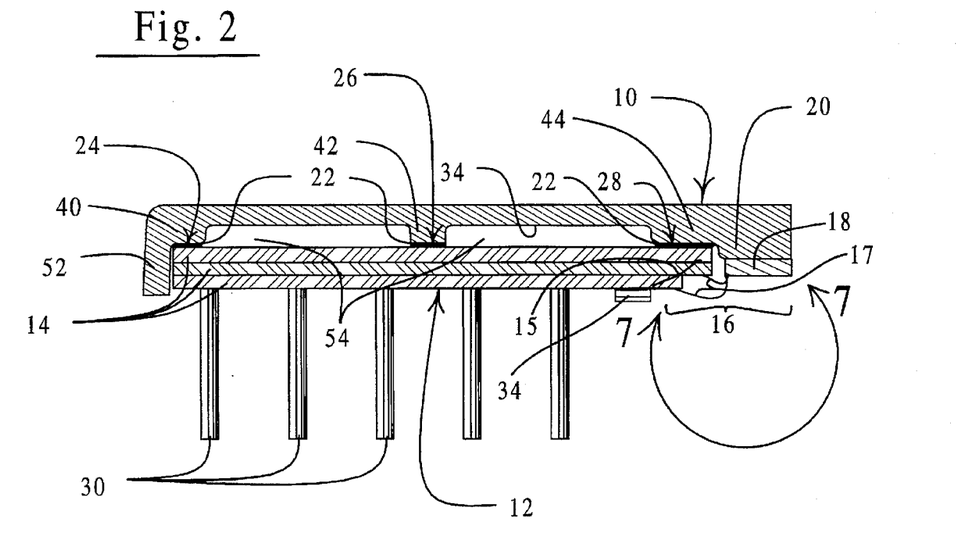
FIG. 2 shows the package of FIG. 1 in a detail cut-away view.

FIG. 1 shows a preferred embodiment of the present invention as a pin grid array package. FIG. 2 shows greater detail of the cut-away of FIG. 1. The mechanical foundation for the package is a case 10 comprised of thermally conductive material. In the preferred embodiment of the package, that material is most commonly copper or aluminum or alloys of those materials. Case 10 encloses one surface and the outside edges of a substrate 12. Substrate 12 is an electrical interconnect structure or circuit board, comprised of multiple layers of dielectric material 14 that supports and separates conductive circuits fabricated on the dielectric material 14. The center portion of the substrate is open to form a cavity 16 (also see FIG. 3) that will accommodate attachment and wire bonding of the semiconductor die 18 for which the specific packages is designed. Cavity 16 is also sized to accommodate a pedestal 20 raised on the inside surface of the back of case 10, that in itself, is sized to facilitate the attachment of die 18. Cavity 16 also includes a wire bond area 15 that has surfaces for attaching the wire bonds 17 to substrate 12. The physical limits of cavity 16 are defined by a seal ring 32 that may be added to the surface of substrate 12 as illustrated in FIG. 2, or it may be integral to substrate 12.

Substrate 12 is rigidly affixed to case 10 by an adhesive material 22 applied between the inside of case 10 and the back surface of substrate 12. In the preferred embodiment, adhesive 22 is a solder and the joined areas of substrate 12 and case 10 are limited to predetermined regions. The attachment regions are indicated by numerals 24, 26, and 28 and are categorized in three groups; peripheral attachment points 24, interior attachment points 26, and die periphery attachment area 28. There is a great deal of latitude in choosing the size, shape, and position of peripheral attachment points 24 and interior attachment points 26. The details of the position and shape of attachment points 24 and 26 are determined by consideration of the electrical, thermal and mechanical requirements of the package. In the preferred embodiment of the package, die periphery attachment area 28, completely encircles pedestal 20, and the width of the attachment area is determined by consideration of the support required for wire bonding on substrate 12.

Figure 4:
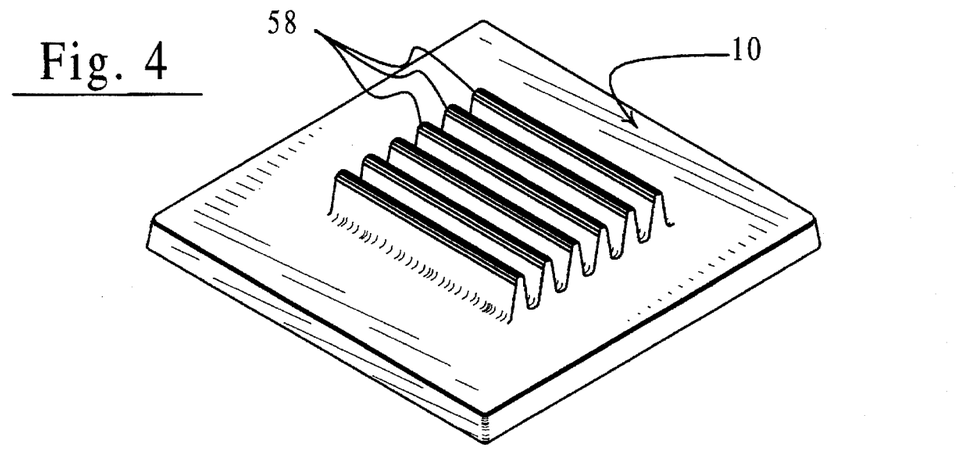
FIG. 4 shows a package case with integral heat fins.
Figure 6:
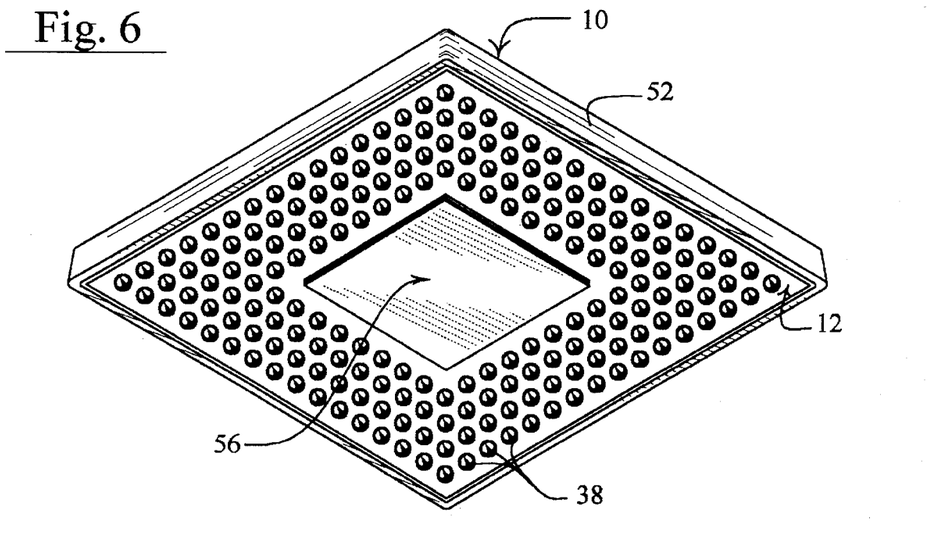
FIG. 6 shows a bottom view of a completed package with solder ball leads.

Attached to the outside surface of substrate 12 are the leads for connecting the package to the next level of an electronic system. Pins 30 are illustrated in FIG. 1 and FIG. 2, but any interconnect scheme appropriate for area array semiconductor packages may be employed. Particularly appropriate are metalized pads 36, formed on the surface of the substrate as illustrated in FIG. 4 and solder balls 38 as illustrated in FIG. 6.

Figure 3:
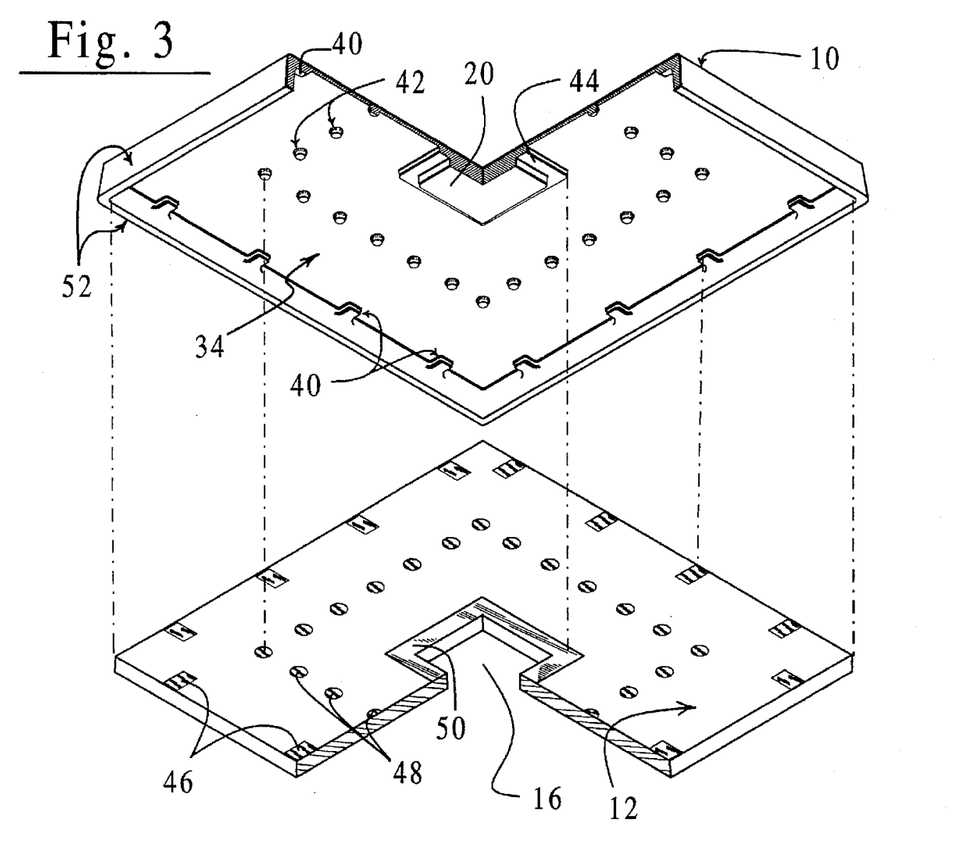
FIG. 3 shows details of the mating surfaces of the package case and substrate.

FIG. 3 illustrates the details of the inside of case 10. The portions of case 10 that will be part of the attachment points between case 10 and substrate 12 are defined by areas that stand proud of the primary surface 34 of the inside of case 10, or attachment pedestals. Peripheral attachment pedestals 40 are positioned around the inside edge of case 10 and in one preferred embodiment, attached to the side wall 54 of the inside of case 10. The positions and configuration of peripheral attachment pedestals 40 are chosen so as to mechanically support the edges of substrate 12 and to make the most advantageous electrical connections between the circuits that are a part of substrate 12 and case 10. Interior attachment pedestals 42 are similar to peripheral attachment pedestals 38 except that they do not make contact with the side walls 52 of case 10. The die periphery attachment pedestal 44 completely surrounds the die attach pedestal 20. All of the attachment pedestals 40, 42, and 44 have surfaces parallel to the primary surface 34 of the inside of case 10 and lay in substantially the same plane. In addition, all of the attachment pedestals have surfaces that are prepared in such a way as to readily form a secure bond with the adhesive used to bond case 10 to substrate 12. While the preferred embodiment of the present invention includes attachment pedestals of the three types cited, the requirement is for surfaces of sufficient total area to rigidly bond case 10 to substrate 12 and support substrate 12 as necessary to withstand the forces associated with handling and mounting within an electronic system. When substrate 12 and case 10 are attached to each other, structural cavities 54 (shown in FIG. 2) are formed between case 10 and substrate 12.

Also illustrated in FIG. 3 are the details of the pads on substrate 12 that are part of the attachment between case 10 and substrate 12. Peripheral attachment pads 46, interior attachment pads 48, and die periphery attachment pad 50, correspond positionally with like named pedestals in case 10. Like the attachment pedestals, the surfaces of the attachment pads are substantially coplanar. The surfaces of the attachment pads are also prepared in such a manor as to form a strong and secure bond with the attachment adhesive.

Case 10 and substrate 12 are assembled by applying adhesive material 22 to the attachment points of either case 10, substrate 12, or both. In the case of the preferred embodiment described here wherein solder is used as the adhesive, the solder can be applied as a preform, paste, or by solder dipping. Substrate 12 and case 10 are assembled as indicated in FIG. 4, such that the applied solder substantially makes contact with the attachment surfaces of case 10 and substrate 12. The assembly is than heated to above the reflow temperature of the solder to reflow the solder and form a metallurgical bond between case 10 and substrate 12.

In the case wherein the adhesive is an organic material, assembly precedes substantially the same, following the manufactures recommendations for curing or setting the adhesive.

FIG. 4 illustrates case 10 of the current invention with heat fins 58 included as an integral part of case 10. In addition to features of various design for increasing the heat dissipating area of case 10, it possible and practical to include features such as logos and identification marks as raised or depressed portions of case 10.

Figure 5:
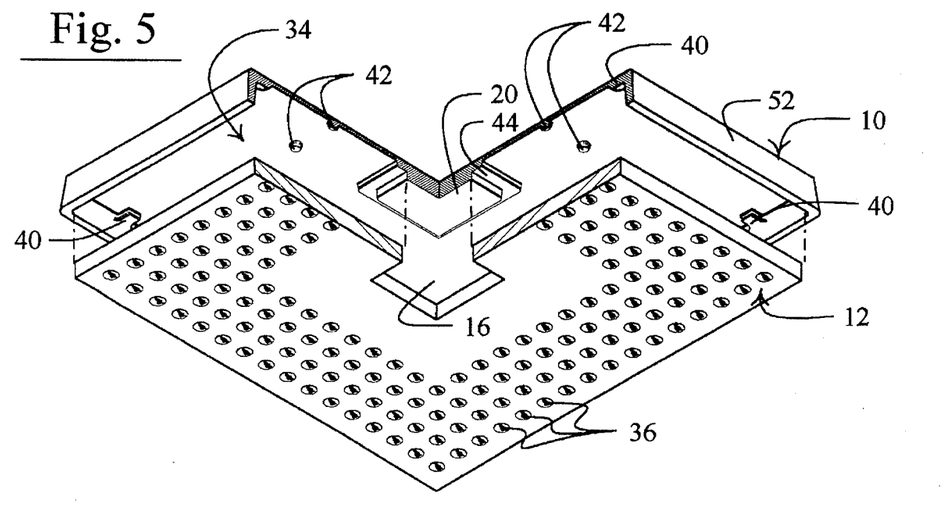
FIG. 5 shows the relationship of the package case and substrate with conductive pad leads, as they are brought together for assembly.

FIG. 5 Illustrates the relationship between case 10 and substrate 12 as they are brought together to attach each to the other. Also illustrated in FIG. 5 are conductive pads 36 which are one of the preferred embodiments for exterior package leads.

FIG. 6 illustrates the bottom of a completed package, with solder balls 38 which are another preferred embodiment for the exterior package leads. Numeral 56 of FIG. 6 indicates the sealed die attach cavity area of substrate 12.

Figure 7A:
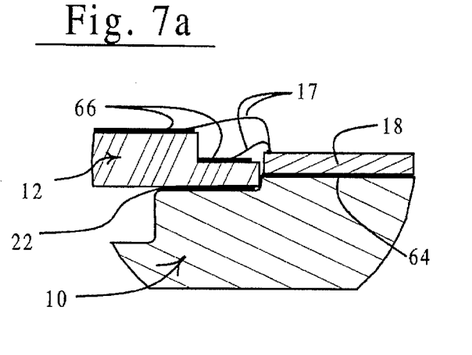
FIG. 7a to 7e show detail cross sections of the die attach area of FIG. 2 illustrating various methods of connecting the die to the package.
Figure 7B:
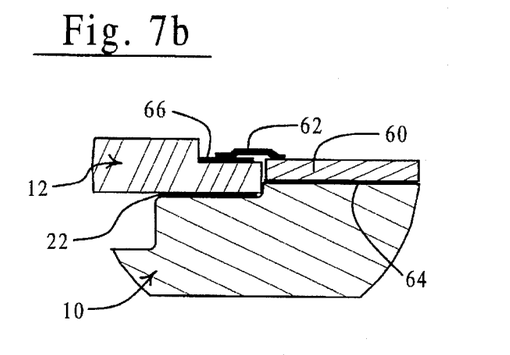
Figure 7C:
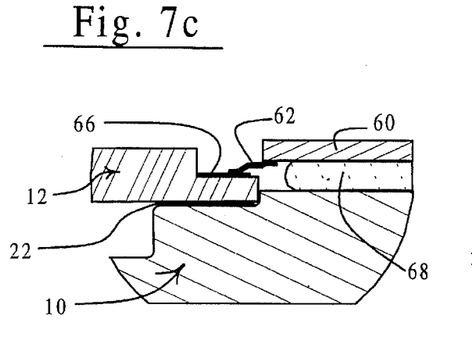

FIG. 7a through FIG. 7c illustrate details of the cavity area 16 of FIG. 2. Each of the figures represents a different method of mounting the semiconductor die and making electrical contact from the die to the substrate. These connections are also known as the first level interconnection. FIG. 7a illustrates what is currently the most common first level interconnect scheme. Die 18 is attached with a die attach adhesive 64 and electrical connections are made with wire bonds 17. While a two tier bonding scheme is illustrated, the package may be designed with only one, or more than two bond tiers. FIG. 7b and FIG. 7c both represent a first level interconnect scheme known as tape automated bonding, or TAB. FIG. 7b shows a TAB die 60 mounted conventionally with die attach adhesive 64. The TAB lead 62 makes the electrical connection from the TAB die 60 to the bond pad 66 on substrate 12. FIG. 7c illustrates a TAB first level interconnect wherein TAB die 60 is inverted relative to convention. The electrical connection is still make with TAB lead 62 between die 60 and bond pad 66. A layer of a thermally conductive material such as thermal gel 68 may be included to improve thermal contact between die 60 and case 10.

Figure 7D:
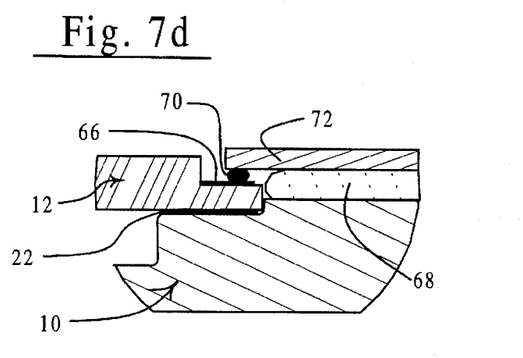
Figure 7E:
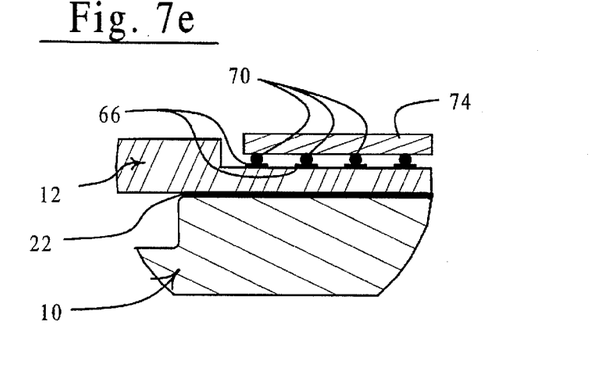

FIG. 7d and FIG. 7e represent the first level interconnect scheme known as flip chip or C4, wherein the electrical connection is made with small solder balls 70 deposited on the surface of flip chip die 72 and 74. Die 72 or 74 is positioned such that solder balls 70 make contact with pads 66. The solder is than melted to form a bond between balls 70 and pads 66. FIG. 7d illustrates flip chip first level interconnect wherein solder balls 70 are distributed only around the periphery of flip chip die 72. A thermally conductive material such as thermal gel 68 is used to insure an adequate thermal connection between die 60 and case 10. FIG. 7e illustrates flip chip first level interconnect wherein solder balls 70 can be distributed across the entire area of an area array flip chip die 74.

First level interconnect methods such as illustrated in FIG. 7e, wherein die 74 is separated from case 10 by a portion of substrate 12, can be thermally concerted to case 10 by the incorporation of regions of high thermal conductivity, fabricated within substrate 12. These regions of high thermal conductivity are known as thermal vias and may be arranged in a regular array or may be positioned at points where extra thermal transfer capability is needed.

OPERATION

FIGS. 1–7

Case Design and Materials

In the preferred embodiment of the package, case 10 is comprised substantially of copper or a copper alloy. While copper has many desirable properties for this application, many other metals could be employed. In addition to metals, there are a number of materials that combine thermoset and thermoplastic resins with metal particles to produce composite materials that exhibit relatively high thermal conductivities and are very easily and economically formed by molding. The basic requirements of a material in this application are: 1) the ability to be formed into relatively complex and precise shapes inexpensively; 2) thermal conductivity sufficient to remove the heat generated by the device for which the packages is designed; 3) mechanical strength sufficient to support the package in its intended environment; 4) a surface that is either chemically stable or can be economically treated to make it stable and accepting of a virtually indelible identification mark; 5) materials costs are no greater than those of copper.

Case 10 of the present invention is also well suited to serve as a ground plane for the package. Covering the entire area of the substrate and with the flexibility to make an electrical connection, it is easy to design a ground system that has minimal inductance and the lowest possible current density. The result is minimum induced voltage in the ground circuit when outputs switch simultaneously.

In the present invention, there is a structural cavity 54, shown in FIG. 1 and FIG. 2, that occupies most of the space between case 10 and substrate 12. The only interruptions to cavity 54 are the attachment pedestals 40, 42, and 44. In most embodiments of the present invention, cavity 54 will be filled with air, which will therefore be the dielectric material between the circuitry of the top surface of substrate 12 and the inside of case 10. With a dielectric constant of one, as opposed to the dielectric constant of around four for the substrate dielectric material, the availability of the cavity dielectric provides additional design options that enhance the ability to design the package to meet the exact requirements of the device for which the package is being created. While the objective is usually to use materials with lower dielectric constants, it is occasionally advantageous to use materials with high dielectric constants to achieve specific electronic performance. Cavity 54 allows for the application of such materials at very little cost. It is possible to fill the entire cavity or only a small portion with different dielectric, depending on the requirements of the specific application.

The design of case 10 of the present invention is relatively straight forward. The interior must be sized and shaped to accommodate substrate 12 and die attach pedestal 20 must fit, with minimum clearance, inside die attach cavity 16 of substrate 12. Attachment pedestals 40 and 42 are designed to provide the required mechanical support and electrical contact between case 10 and substrate 12. While pedestals 40 and 42 are illustrated in FIG. 3 as being small, uniform and arranged in a regular array, there are very few constraints as to the those criteria. It is important that the total area and the distribution of that area anticipate the mechanical stress that will be placed on the package during handling and through the process that will join the package to the system of which it will become a part. Those requirements very based on the interconnect method of the package in question. Pin grid array packages may be subjected to insertion and removal from sockets that require several ounces of force on each pin to move the pin within its socket. Pad grid arrays, on the other hand, are likely to be clamped to a board with a force of from one to five ounces per pad, but there will never be any force acting to pull substrate 12 away from case 10. In the case of a ball grid array, there will most probably be no force applied perpendicular to substrate 12, but there will probably be considerable stress in the interconnect system parallel to substrate 12.

Once the mechanical requirements to meet the anticipated environmental and use demands are met, the position and shape of pedestals 40 and 42 should be chosen to maximize electrical performance. Pedestals 40 and 42 can be of any shape desired except that they should not form closed cavities with no vent to the outside. If a majority of the surface of substrate 12 and case 10 are to be joined together, care should be taken to assure that voids are not likely to form within the areas that is designed to be occupied by adhesive, be it solder or an epoxy material.

Referring to FIG. 2 and FIG. 3, attachment pedestal 44 serves several functions. First it creates a closed bottom of the die attach cavity. With this requirement, pedestal 44 must completely encircle die attach pedestal 20. For purposes of sealing die attach cavity 20, pedestal 44 should be at least 0.5 mm wide.

The other predominate functions of pedestal 44 are to rigidly fix the interior portion of substrate 12 around the die attach pedestal 20 of case 10, and to rigidly support the wire bond area 15 that exists on the opposite side of substrate 12 from attachment pad 50. The configuration of pedestal 44 to adequately support the wire bonding area 15 depends on the configuration of the of wire bond area 15. The basic requirement is that a solder joint exist on the opposite side of substrate 12 from wire bond area 15 and directly opposite wire bond area 15. In virtually all cases, the requirement for solid attachment of substrate 12 around die attach pedestal 20 will be satisfied by the requirement to close the bottom of die cavity 16 and to support wire bond area 15. The basic requirement is that normal handling and use will not cause the attachment to fail.

EXTERIOR PACKAGE LEADS

The exterior electrical connections, or leads of the package are provided as a method of electrically connecting the package and its circuitry to a larger electronic system. The package leads are also known as the second level interconnect; the connection of the die to the package being the first level interconnect. There are three preferred embodiments of my package with respect to the second level interconnect. The three preferred embodiments are illustrated as pins 30 shown in FIG. 2, conductive pads 36 shown in FIG. 5, and solder balls 38 shown in FIG. 6. Other possible embodiments of the second level interconnect in the current invention could include, but are not limited to, solder columns or leads of substantially planar cross section that are straight or formed into gull wing, "L" or "J" shapes.

SUBSTRATE DESIGN AND MATERIALS

Substrate 12 as shown in FIG. 3 serves as a vehicle for electrically attaching semiconductor die 18 to the exterior package leads and provides for the attachment of the leads to the package and the local mechanical support for those leads. The substrate is comprised of multiple layers of dielectric material with conductive material making connections between wire bond area 15 and the external package leads. In the preferred embodiment of the package, the conductive material is copper, deposed as either fine wires or as planar strips. The conductive connections are positioned on the surface of, and between the layers of dielectric material 14 (shown in FIG. 2) of substrate 12.

The mechanical requirements of substrate 12 are largely reliant on the properties of the dielectric material. In the present invention, case 10 provides most of the mechanical properties of the overall package. The remaining mechanical requirement that must be satisfied by the substrate is sufficient strength to support the forces that will be applied to the external package leads. As stated earlier, those requirements very based on the interconnect method of the package in question. In the preferred embodiment of the current invention, the dielectric material is one of the materials commonly used for printed circuit boards such as FR-4, bismelamide triazene (BT), or ployamide. Virtually all of the these common materials have sufficient mechanical strength to be used in substrate 12 of the current invention.

The other requirement of the dielectric material used in the preferred embodiment of the package is that it be capable of withstanding temperature excursions above 250° C. without significant degradation of either its mechanical properties or the strength of adhesion of the conductive material to the dielectric material. In other embodiments of the current invention, wherein an epoxy material is used as an adhesive to attach substrate 12 to case 10, the dielectric material must be capable of withstanding the cure cycle of the epoxy without undue degradation. Typically, suitable thermoset epoxies cure in the range of 125° C. to 175° C. in from 30 minutes to 4 hours. It is also possible to use thermoplastic materials as attachment adhesives. These materials typically require thermal cycles to around 200° C. but typically need be exposed to those temperatures for only from one to five minutes.

Eliminating much of the mechanical requirement for the substrates of conventional packages with area array leads means that the selection of the substrate materials can be determined primarily by consideration of electrical properties and cost of the dielectric material. For most applications, this means lower cost substrate materials since materials such as lower cost FR-4 do have adequate electrical properties but do not have the mechanical properties required for a molded package.

Attachment pads 46, 48, and 50, shown in FIG. 3, are designed to be similar in size and shape to attachment pedestals 40, 42, and 44 respectively. The surfaces of attachment pads 46, 48, and 50 are prepared such as to form a strong bond to the adhesive material used to attach them to pedestals 40, 42, and 44, respectively. In the preferred embodiment, pads 46, 48, and 50 are comprised of copper and their surfaces are prepared to be substantially free of coatings or oxides so as to promote wetting by the solder used as an adhesive.

The solder used as an adhesive for the preferred embodiment of the package can be any solder alloy that will not melt at the temperatures the package will be exposed to during the processing required to attach, connect and seal the semiconductor die 18 in the package, or during the mounting of the package in the system of which it will become a part. Typically, that requires the melting point of the solder to be above 200° C. One solder alloy that meets all of the requirements is comprised of 96.5% tin and 3.5% silver. This material melts at 221° C. and has the added advantage that it does not contain lead.

THERMAL AND DESIGN FEATURES

While the large area of case 10 significantly enhances the transfer of thermal energy from the package to the environment, it is often advantages to increase the surface area of the heat transfer surface of the package even more. In conventional packages, that is accomplished by attaching an external device, typically a set of fins, pins or plates, to the back of the package. In the current invention, it is possible to include package features that increase the heat transfer surface area by forging those features into case as shown in FIG. 7. The heat fins 58 are formed in the same forming operation that produces the rest of case 10. As such, the advantages of the additional surface area is included for only the cost of the small amount of additional material. Forming heat fins 58 as an integral part of case 10 increases the efficiency of the increased area when compared to an add-on heat surface increasing device. They do so by eliminating the attachment surface and the inherent thermal resistance associated with any discontinuity in the thermally conductive material. The design of heat fins 58 can be any that is consistent with the forming method used to produce case 10.

In addition to thermal enhancement features, design features such as logos, identification marks or decorative surface treatments can be incorporated in the top surface of case 10. The only limitation to the features possible is that they be compatible with the forming methods employed to manufacture case 10.

In the preferred embodiment, wherein case 10 is comprised of copper or a copper alloy, it is desirable to treat the surface of case 10 to prevent oxidation and to improve appearance. Among the potential treatments are plating operations and procedures that chemically change the surface to produce a variety of colors and special effects.

SUMMARY, RAMIFICATIONS AND SCOPE

Accordingly, the reader will see that the area array package of this invention can provide a package for high performance semiconductor device, that provides a very high level of electrical and thermal performance at a cost that is less than that of competing technologies. In addition to exceptional electrical and thermal performance, the package of this invention possesses a very high quality appearance that generates a perception of high value that is consistent with the high price of the semiconductor device that the package will contain. Further that the area array package of the present invention has additional advantages in that:

the substrate that forms the electrical interconnect system of the package can be chosen for its electrical and economic properties to a greater degree than if it were also the mechanical basis of the package;

where the choice of acceptable substrate materials for molded packages has been limited to the products of one vendor, the elimination of the rigid mechanical requirements for the substrate expand the available vendor base to at least five companies;

the construction of the package provides for the economical use of dielectric materials with substantially different dielectric properties which increases the flexibility to design a given package to meet the requirements of the die for which it is intended;

the color and surface texture of the package can be changed to adjust the perception of an observer of the package by changing the coating or plating of the surface of the case, or by changing the finish texture as produced by the forming method;

logos and identification or registration marks can be made a permanent part of the package that cannot be inconspicuously erased or altered.

It should be noted that the preceding descriptions are directed at particular embodiments of the present invention and that they should not be construed as limiting the invention. Also, that various modifications and other embodiments of the present invention will be apparent to one of ordinary skill in the art to which the present invention pertains. For example, the contours of both the inside and outside of the case can be changed in many ways to accommodate specific applications. There are also many materials that could be used to produce the case that satisfy the requirements for thermal conductivity and economic manufacturing methods. Furthermore, it is recognized that the external package leads of the present invention, regardless of the lead structure need not be arranged in a regular array. Similarly, that the arrangement of attachment areas need not be in a regular array configuration. It is also recognized that there are die attach and first level interconnect schemes other than those discussed that may be applied to the present invention Therefore, while the present invention has been described in conjunction with particular embodiments it is to be understood that these various modifications and other embodiments of the present invention may be made without departing from the scope of the present invention as described herein and as claimed in the appended claims.

I claim:

1. A package for a semiconductor device comprising an enclosure, a connecting means for electrically connecting between said semiconductor device and an interconnecting means, said interconnecting means for electrically interconnecting said connecting means to another electronic system; said connecting means comprising in combination:

(a) a substantially planar structure having a first surface and a second surface, said first surface being separated from said second surface by a thickness;

(b) a plurality of attachment pads, arrayed on said first surface, for forming an attachment between said connecting means and said enclosure;

(c) a plurality of first level interconnect pads, arrayed on said connecting means, for establishing electrical connections from said semiconductor device to said connecting means;

(d) a mounting means for mounting said semiconductor device such that the thermal resistance between said semiconductor device and said enclosure is reduced and said semiconductor device is positioned substantially concentric with respect to the array of said plurality of first level interconnect pads, and with the active surface of said semiconductor device substantially parallel to the major surfaces of said connecting means; and (e) a plurality of electrically conductive members, arranged to distribute electrical signals among said first level interconnect pads and said interconnecting means, said electrically conductive members being supported and separated by an electrically insulating material;

said interconnecting means comprising an array of contacting structures which are accessible from said second surface of said connecting means and are in electrical contact with said electrically conductive members;

said enclosure comprising in combination:

(a) a structure comprised of thermally conductive material and sized to substantially enclose said first surface and the edges of said connecting means, having an exterior surface and an interior surface; and (b) an attachment means for mounting said connecting means to said interior surface comprising a plurality of pedestals positioned such that individual ones of the plurality of pedestals correspond with individual ones of the plurality of attachment pads of said connecting means;

said connecting means being attached to the interior surface of said enclosure by an adhesive material between the attachment means of said enclosure and the attachment pads of said connecting means;

whereby providing a package for a high performance semiconductor device that can be produced at reduced cost while providing electrical, thermal and cosmetic properties that are superior to current art.

2. The package of claim 1 wherein said contacting structures are chosen from the group consisting of pins, columns, balls, bumps and pads.

3. The package of claim 1 wherein said thermally conductive material is selected from the group consisting of copper, copper alloys, aluminum, aluminum alloys, and thermally conductive resinous materials.

4. The package of claim 1 wherein said connecting means is a printed circuit board.

5. The package of claim 1 wherein said adhesive material is solder.

6. The package of claim 1 wherein said adhesive material is epoxy.

7. The package of claim 1 wherein said mounting means comprises an aperture in said connecting means exposing a surface of said enclosure which is substantially parallel to the surfaces of said connecting means.

8. The package of claim 1 wherein said mounting means comprises a plurality of first level interconnect pads disposed on a surface of said connecting means in an array to match the respective solder bumps of a predetermined semiconductor device intended for flip chip assembly.

9. The package of claim 1 wherein said mounting means comprises a portion of said second surface of said connecting means.

* * * * *